United States Patent
Oh et al.

(10) Patent No.: US 11,699,227 B2
(45) Date of Patent: Jul. 11, 2023

(54) METHOD OF VERIFYING ERROR OF OPTICAL PROXIMITY CORRECTION MODEL

(71) Applicant: Samsung Electronics Co., Ltd., Suwon-si (KR)

(72) Inventors: Heungsuk Oh, Bucheon-si (KR); Mincheol Kang, Hwaseong-si (KR); Sangwook Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 213 days.

(21) Appl. No.: 17/384,366

(22) Filed: Jul. 23, 2021

(65) Prior Publication Data

US 2022/0180503 A1 Jun. 9, 2022

(30) Foreign Application Priority Data

Dec. 7, 2020 (KR) .................. 10-2020-0169480

(51) Int. Cl.
*G06K 9/00* (2022.01)
*G06T 7/00* (2017.01)
(Continued)

(52) U.S. Cl.
CPC .............. *G06T 7/0006* (2013.01); *G03F 1/36* (2013.01); *G06F 18/2148* (2023.01);
(Continued)

(58) Field of Classification Search
CPC .......... G06T 7/0006; G06T 7/50; G06T 7/60; G06T 2207/10061; G06T 2207/20081;
(Continued)

(56) References Cited

U.S. PATENT DOCUMENTS 10,504,004 B2    12/2019  Kaufhold et al.
10,657,368 B1 *   5/2020  Edmund .............. G06V 30/418
(Continued)

FOREIGN PATENT DOCUMENTS

CN      111051993 A  *  4/2020  .............. G03F 1/36
KR   1020190100881 A     8/2019
(Continued)

OTHER PUBLICATIONS

Optimization of Machine Learning Guided Optical Proximity Correction, Joonhyuk Cho et al., IEEE, 2018, pp. 921-924 (Year: 2018).*

(Continued)

*Primary Examiner* — Jayesh A Patel
(74) *Attorney, Agent, or Firm* — Muir Patent Law, PLLC

(57) ABSTRACT

A method of fabricating a semiconductor device includes generating a mask based on second layout data obtained by applying an OPC model to first layout data and performing a semiconductor process using the mask on a substrate, obtaining a plurality of pattern images by selecting a plurality of sample patterns from the substrate, selecting sample images corresponding to the sample patterns from each of the first layout data, the second layout data, and simulation data obtained by performing a simulation based on the second layout data, generating a plurality of input images corresponding to the sample patterns by blending the sample images corresponding to the sample patterns, respectively, and generating an error prediction model for the OPC model by training a machine learning model using a data set including the input images and the pattern images.

20 Claims, 14 Drawing Sheets

(51) Int. Cl.
| | |
|---|---|
| G06T 7/50 | (2017.01) |
| G06T 7/60 | (2017.01) |
| G03F 1/36 | (2012.01) |
| G06V 10/30 | (2022.01) |
| G06V 10/42 | (2022.01) |
| G06V 10/88 | (2022.01) |
| G06F 18/22 | (2023.01) |
| G06F 18/214 | (2023.01) |

(52) U.S. Cl.
CPC ............... G06F 18/22 (2023.01); G06T 7/50 (2017.01); G06T 7/60 (2013.01); G06V 10/30 (2022.01); G06V 10/42 (2022.01); G06V 10/88 (2022.01); G06T 2207/10061 (2013.01); G06T 2207/20081 (2013.01); G06T 2207/20084 (2013.01); G06T 2207/30148 (2013.01)

(58) Field of Classification Search
CPC . G06T 2207/20084; G06T 2207/30148; G03F 1/36; G06V 10/30; G06V 10/42; G06V 10/88
See application file for complete search history.

(56) References Cited

U.S. PATENT DOCUMENTS

| | | | |
|---|---|---|---|
| 10,657,638 B2 | 5/2020 | Milligan | |
| 10,733,744 B2* | 8/2020 | Ha | G06F 30/00 |
| 2004/0019870 A1* | 1/2004 | Ohmori | G03F 1/36 |
| | | | 716/52 |
| 2005/0022150 A1* | 1/2005 | Liu | G03F 1/36 |
| | | | 430/30 |
| 2007/0111112 A1* | 5/2007 | Huh | G03F 1/84 |
| | | | 430/5 |
| 2007/0124719 A1* | 5/2007 | Yun | G06F 30/39 |
| | | | 716/55 |
| 2007/0162887 A1* | 7/2007 | Suh | G03F 1/36 |
| | | | 716/54 |
| 2008/0189673 A1* | 8/2008 | Ying | G03F 1/36 |
| | | | 716/52 |
| 2010/0070944 A1* | 3/2010 | Wu | G03F 1/44 |
| | | | 716/53 |
| 2012/0202351 A1* | 8/2012 | Cha | G03F 1/00 |
| | | | 438/758 |
| 2014/0007023 A1* | 1/2014 | Shin | G06F 30/398 |
| | | | 716/51 |
| 2017/0193400 A1* | 7/2017 | Bhaskar | G06N 3/08 |
| 2019/0257767 A1 | 8/2019 | Shaubi et al. | |
| 2020/0133117 A1* | 4/2020 | Chu | G03F 1/22 |

FOREIGN PATENT DOCUMENTS

| | | | | |
|---|---|---|---|---|
| WO | WO-2008029611 A1 * | 3/2008 | ............... | G03F 1/36 |
| WO | WO-2008090816 A1 * | 7/2008 | ............... | G03F 1/36 |
| WO | 2017171890 A1 | 10/2017 | | |
| WO | WO-2017171890 A1 * | 10/2017 | | |
| WO | WO-2019048506 A1 * | 3/2019 | ............... | G03F 1/36 |
| WO | WO-2019190566 A1 * | 10/2019 | ............... | G03F 1/36 |

OTHER PUBLICATIONS

Optical proximity correction with hierarchical Bayes model, Tetsuaki Matsunawa et al., SPIE, 2016, pp. 021009-1 to 021009-8 (Year: 2016).*

Optical Proximity Correction Using Bidirectional Recurrent Neural Network (BRNN), Yonghwi Kwon et al., SPIE, 2019, pp. 1-9 (Year: 2019).*

A fast and manufacture-friendly optical proximity correction based on machine learning, Xu Ma et al., Elsevier, 2017, pp. 15-26 (Year: 2017).*

Neural Network Classifier-Based OPC With Imbalanced Training Data, Suhyeong Choi et al., IEEE, 2018, pp. 938-948 (Year: 2018).*

From IC Layout to Die Photograph: A CNN-Based Data-Driven Approach, Hao-Chiang Shao, IEEE, 2021, pp. 957-970 (Year: 2021).*

Laplacian eigenmaps- and Bayesian clustering-based layout pattern sampling and its applications to hotspot detection and optical proximity correction, Tetsuaki Matsunawa et al., SPIE, 2016, pp. 043504-1 to 043504-10 (Year: 2016).*

NIPS 2016 Tutorial: Generative Adversarial Networks, Ian Goodfellow, aeXiv, 2017, pp. 1-57 (Year: 2017).*

* cited by examiner

METHOD OF VERIFYING ERROR OF OPTICAL PROXIMITY CORRECTION MODEL

CROSS TO REFERENCE TO RELATED APPLICATION(S)

This application claims priority under 35 U.S.C. § 119 to Korean Patent Application No. 10 to 10-2020-0169480 filed on Dec. 7, 2020 in the Korean Intellectual Property Office, the disclosure of which is herein incorporated by reference in its entirety.

BACKGROUND

Example embodiments of the present disclosure relate to a method of verifying an error of an optical proximity correction (OPC) model.

A semiconductor process may be performed on the basis of layout data. Various patterns may be formed on a semiconductor substrate in an exposure process for generating a mask by transferring layout data, and processes such as etching and deposition processes using the mask generated in the exposure process. To reduce a difference between layout data and patterns formed on the semiconductor substrate, proximity correction may be applied.

SUMMARY

An example embodiment of the present disclosure is to provide a method of effectively verifying an error of an optical proximity correction model (OPC) for optimizing layout data so as to reduce a difference between the layout data for performing a semiconductor process and various patterns formed using the layout data.

According to an embodiment of the present inventive concept, a method of fabricating a semiconductor device includes generating an optical proximity correction (OPC) model, generating first layout data, applying the OPC model to the first layout data to generate second layout data, performing simulation on the second layout data to generate simulation data, generating a mask based on the second layout data, performing a semiconductor process using the mask on a substrate, obtaining a plurality of pattern images by selecting a plurality of sample patterns from the substrate, selecting a plurality of first sample images corresponding to the plurality of sample patterns, a plurality of second sample images corresponding to the plurality of sample patterns, and a plurality of third sample images corresponding to the plurality of sample patterns, from the first layout data, the second layout data, and the simulation data, respectively, generating a plurality of input images by blending the plurality of first sample images, the plurality of second sample images, and the plurality of third sample images, each input image being a blended image of: a corresponding one of the plurality of first sample images, a corresponding one of the plurality of second sample images, and a corresponding one of the plurality of third sample images, and generating an error prediction model for the OPC model by training a machine learning model using a data set including the plurality of input images and the plurality of pattern images.

According to an embodiment of the present invention, a method of fabricating a semiconductor device includes generating an optical proximity correction (OPC) model, generating an error prediction model for the OPC model, selecting a plurality of first test areas from first layout data including design information of semiconductor devices, a plurality of second test areas from second layout data obtained by applying the OPC model to the first layout data, and a plurality of third test areas from simulation data obtained by executing a simulation based on the second layout data, obtaining a plurality of first test images, a plurality of second test images, and a plurality of third test images from the plurality of first test areas, the plurality of second test areas, and the plurality of third test areas, respectively, obtaining a plurality of test data by blending the plurality of first test images, the plurality of second test images, and the plurality of third test images, each test data being obtained by blending a corresponding one of the plurality of first test images, a corresponding one of the plurality of second test images, and a corresponding one of the plurality of third test images, and predicting a critical dimension of each of a plurality of test patterns disposed in the plurality of first to third test areas by inputting the plurality of test data to the error prediction model for the OPC model.

According to an embodiment of the present invention, a method of fabricating a semiconductor device includes generating first layout data, applying a first optical proximity correction (OPC) model to the first layout data to generate second layout data, obtaining a plurality of pattern images from a plurality of selected areas of a substrate on which a semiconductor process is performed using a mask formed from the second layout data, extracting a plurality of input images corresponding to the plurality of pattern images from a plurality of sample areas of the second layout data, the plurality of sample areas corresponding to the plurality of selected areas, generating a first error prediction model by training a machine learning model using a data set including the plurality of input images and the plurality of pattern images, extracting a plurality of test images from a plurality of test areas of the second layout data, different from the plurality of sample areas, and inputting the plurality of test images to the first error prediction model, and verifying an error of the first OPC model using a predictive value generated by the first error prediction model.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
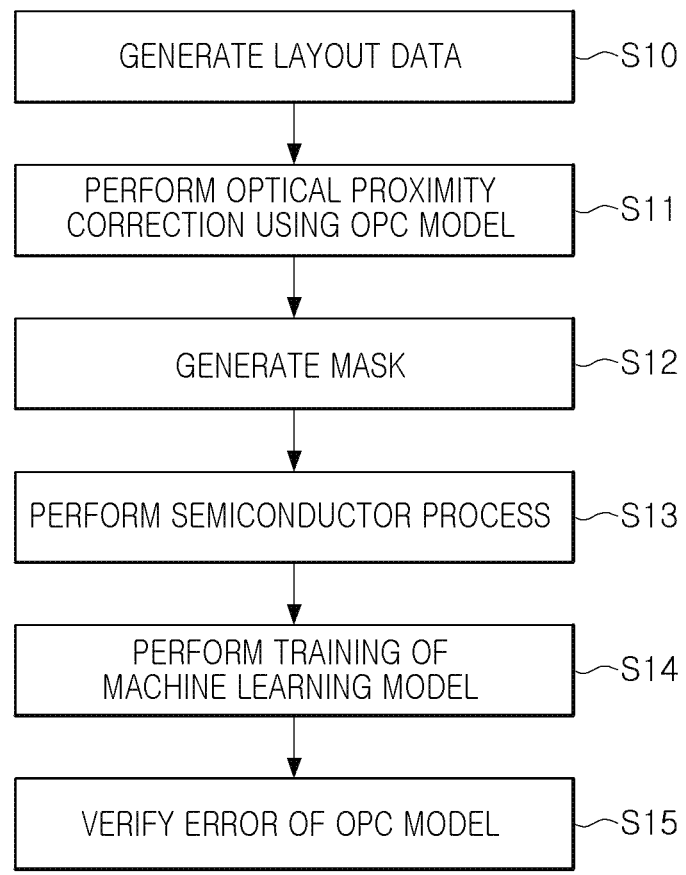
FIGS. 1 and 2 are diagrams illustrating a semiconductor process according to an example embodiment of the present disclosure.
Figure 2:
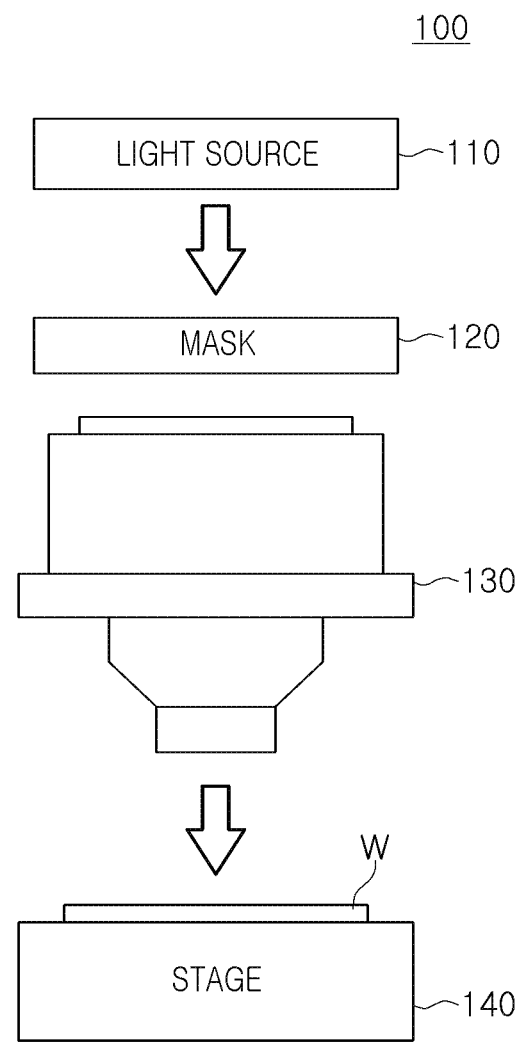

FIGS. 1 and 2 are diagrams illustrating a semiconductor process according to an example embodiment.

The semiconductor process may include various processes such as a deposition process, an etching process, and a polishing process, and various patterns may be formed on a semiconductor substrate and/or layers formed on the semiconductor substrate by those semiconductor processes. In an example embodiment, to form the patterns, a mask (i.e., a photomask) generated from layout data, having a shape corresponding to the patterns, may be used. However, due to errors occurring in the process of generating a mask from layout data and/or performing an etching process, a deposition process, and a polishing process using the mask, there may be a difference between a shape of the patterns included in the layout data and a shape of actual patterns formed by the semiconductor process.

Referring to FIG. 1, layout data designing patterns to be formed may be generated (S10). In example embodiments, a design rule check (DRC) for the layout data and/or a layout versus schematic (LVS) for verifying whether the layout data matches an originally intended design may be performed.

When the layout data is determined by the above processes, optical proximity correction (OPC) may be performed for the layout data (S11). When the layout data is determined as a result of the optical proximity correction, a photolithography process may be performed using the layout data to generate a mask (S12).

When the mask is generated, a semiconductor process may be performed using the mask (S13). For example, an etching process of removing a semiconductor substrate or layers disposed on the semiconductor substrate may be performed in an area exposed by the mask. By the etching process described above, predetermined patterns may be formed on the semiconductor substrate.

When the semiconductor process is completed, training of a machine learning model may be performed (S14). The training of the machine learning model may be performed, based on the layout data generated in processes S10 and S11 and data obtained from the semiconductor substrate on which the semiconductor process has been completed.

As an example, to train the machine learning model, a plurality of sample patterns may be selected from the semiconductor substrate on which the semiconductor process has been completed to obtain a plurality of pattern images. The plurality of pattern images may be scanning electron microscope (SEM) images or transmission electron microscope (TEM) images corresponding to the plurality of sample patterns.

Sample images corresponding to the sample patterns may be selected to perform the training of the machine learning model. The sample images may be selected from the first layout data, the second layout data, and simulation data obtained by performing a simulation based on the second layout data. As an example, the first layout data may be generated in process S10, and the second layout data may be generated in process S11 by applying optical proximity correction using an OPC model to the first layout data. For example, the sample images may be generated by selecting the areas of the semiconductor substrate in which the selected sample patterns are arranged from each of the first layout data, the second layout data, and the simulation data.

In an example embodiment, the machine learning model may include generative adversarial networks (GAN). See, for example, I. Goodfellow, J. Pouget-Abadie, M. Mirza, B. Xu, D. Warde-Farley, S. Ozair, A. Courville, and Y. Bengio, "Generative adversarial nets," in Proc. NIPS, 2014, pp. 2672-2680, the contents of which are incorporated by reference as if fully set forth herein. In the event of inconsistent usages between this document and that document so incorporated by reference, the usage in the incorporated reference (s) should be considered supplementary to that of this document. Input images obtained by blending the sample images obtained from each of the first layout data, the second layout data, and the simulation data may be input to the machine learning model (e.g., GAN). The machine learning model receiving the input images may export output images, and the training of the machine learning model may be performed by comparing the output images with the pattern images obtained from the semi conductor substrate.

The machine learning model of which the training has been completed may be provided as an error prediction model. The error prediction model may be used to verify an error of the OPC model applied to the first layout data for the optical proximity correction in process S11 (S15). For example, a test area in which an error of the OPC model is to be verified may be determined from the first layout data, the second layout data, and the simulation data, and test data extracted from the test area may be input to the error prediction model (e.g., the trained machine learning model). The critical dimension (CD) of the test pattern included in the test area may be measured from predictive data obtained by the error prediction model receiving the test data, and an error of the OPC model may be verified using the measured CD.

FIG. 2 is a diagram illustrating a photolithography system using the mask manufactured according to an example embodiment. A photolithography system 100 may include a light source 110, a mask 120, a reduction projection device 130, and a substrate stage 140. The photolithography system 100 may further include elements not illustrated in FIG. 2. For example, the photolithography system 100 may further include a sensor for measuring a height and a slope of a surface of a semiconductor substrate W.

The light source 110 may emit light of a specific wavelength. Light emitted from the light source 110 may be irradiated to the mask 120. For example, a lens may be disposed between the light source 110 and the mask 120 to adjust a focus of light. The light source 110 may include an ultraviolet light source (e.g., a KrF light source having a wavelength of 234 nm, an ArF light source having a wavelength of 193 nm, or the like). The light source 110 may include a single point light source or may include a plurality of point light sources.

In example embodiments, the light source 110 may be a light source emitting extreme ultraviolet (EUV) having a wavelength between 4 nm and 124 nm. For example, the light source 110 may emit extreme ultraviolet rays having a wavelength between 4 nm and 20 nm, and in example embodiments, the wavelength of extreme ultraviolet rays may be 13.5 nm. When the light source 110 emits extreme ultraviolet rays, the mask 120 may be formed of a material different from the example in which the light source 110 emits an ultraviolet light source. For example, for the light source 110 emitting extreme ultraviolet rays, the mask 120 may include a plurality of silicon layers and a plurality of molybdenum layers alternately stacked, and a ruthenium layer may further be disposed on the plurality of silicon layers and the plurality of molybdenum layers. However, an example embodiment thereof is not limited thereto, and the material and the stacked structure of the mask 120 applied to the light source 110 emitting extreme ultraviolet rays may be varied.

To implement a pre-designed layout on the semiconductor substrate W, the mask 120 may include patterns having various sizes and shapes. The patterns may be formed based on second layout data obtained by applying optical proximity correction to the first layout data generated by a predetermined design tool. The patterns may be defined by a transparent area and an opaque area. The transparent area may be formed by etching a metal layer (e.g., a chromium film) on the mask 120. The transparent area may allow light emitted from the light source 110 to pass therethrough. The opaque area may not allow light to pass therethrough and may block light.

Light passing through the transparent area of the mask 120 may be incident to the reduction projection device 130. The reduction projection device 130 may match patterns to be formed on the semiconductor substrate W to the patterns of the mask 120. Light passing through the transparent area of the mask 120 may be irradiated to the semiconductor substrate W through the reduction projection device 130. Accordingly, the patterns corresponding to the patterns of the mask 120 may be formed on the semiconductor substrate W.

The substrate stage 140 may support the semiconductor substrate W. For example, the semiconductor substrate W may include or may be formed of a silicon wafer. The reduction projection device 130 may include an aperture. The aperture may be used for increasing a depth of focus of ultraviolet light or extreme ultraviolet light emitted from the light source 110. For example, the aperture may include a dipole aperture or a quadruple aperture. The reduction projection device 130 may further include a lens to adjust a focus of light.

As a size of the semiconductor device decreases and integration density increases, a distance between the image patterns of the mask 120 may decrease. Due to the proximity, interference and diffraction of light may occur, and a distorted pattern different from an actual design may be formed on the semiconductor substrate W. When the distorted pattern is printed on the substrate W, the designed circuit does not operate or may operate abnormally.

To prevent distortion of the pattern, a resolution enhancement technique such as optical proximity correction may be used. In the optical proximity correction, the degree of distortion caused by interference and diffraction of light may be predicted in advance by simulation of the OPC model, and the designed layout may be adjusted based on the predicted result. Patterns may be formed on the mask 120 based on the changed layout, and the patterns may be accurately formed on the semiconductor substrate W.

The layout of the semiconductor device may include a plurality of layers. In an example embodiment, optical proximity correction may be performed to adjust the layout of a single layer. In other words, optical proximity correction may be performed independently for each of the plurality of layers. A semiconductor device may be formed by sequentially implementing the plurality of layers on the substrate through the semiconductor process.

Optical proximity correction for each of the plurality of layers may be performed by an OPC model generated for each of the plurality of layers. Since a performance of the optical proximity correction is determined by accuracy of the OPC model, an operation of verifying the error of the OPC model in advance and correcting the error may greatly affect an accuracy and yield of the semiconductor process.

A method of verifying an error of an OPC model may include forming the mask 120 based on layout data for which optical proximity correction is performed by applying the OPC model, performing semiconductor processes on the semiconductor substrate W using the mask 120, and comparing an SEM image or a TEM image measured from the semiconductor substrate W with the layout data. However, it may not be possible to obtain the SEM image or the TEM image form all areas of the semiconductor substrate W, and as the areas from which the SEM image or TEM image is obtained increase, the time required to verify an error of the OPC model may increase.

In an example embodiment, a method of verifying an error of the OPC model using a machine learning model may be suggested. In an example embodiment, pattern images representing sample patterns selected from the semiconductor substrate W on which the semiconductor process has been performed may be obtained in the form of an SEM image or a TEM image, and sample images corresponding to the sample areas may be selected from the layout data. The machine learning model may be trained using a data set including the sample images and the pattern images corresponding thereto.

Test data selected from areas different from the sample patterns in the layout data may be input to the machine learning model on which the training has been completed, and an error of the OPC model may be verified using predictive data output by the machine learning model. For example, by inputting the test data selected from the areas in which it is predicted that it is highly likely that pattern distortion occurs to the machine learning model on which the training has been completed, the verification of the overall layout data may be completed. For example, using the test data selected from the areas with high likelihood of pattern distortion, the accuracy of the trained machine learning model may be verified.

Figure 3:
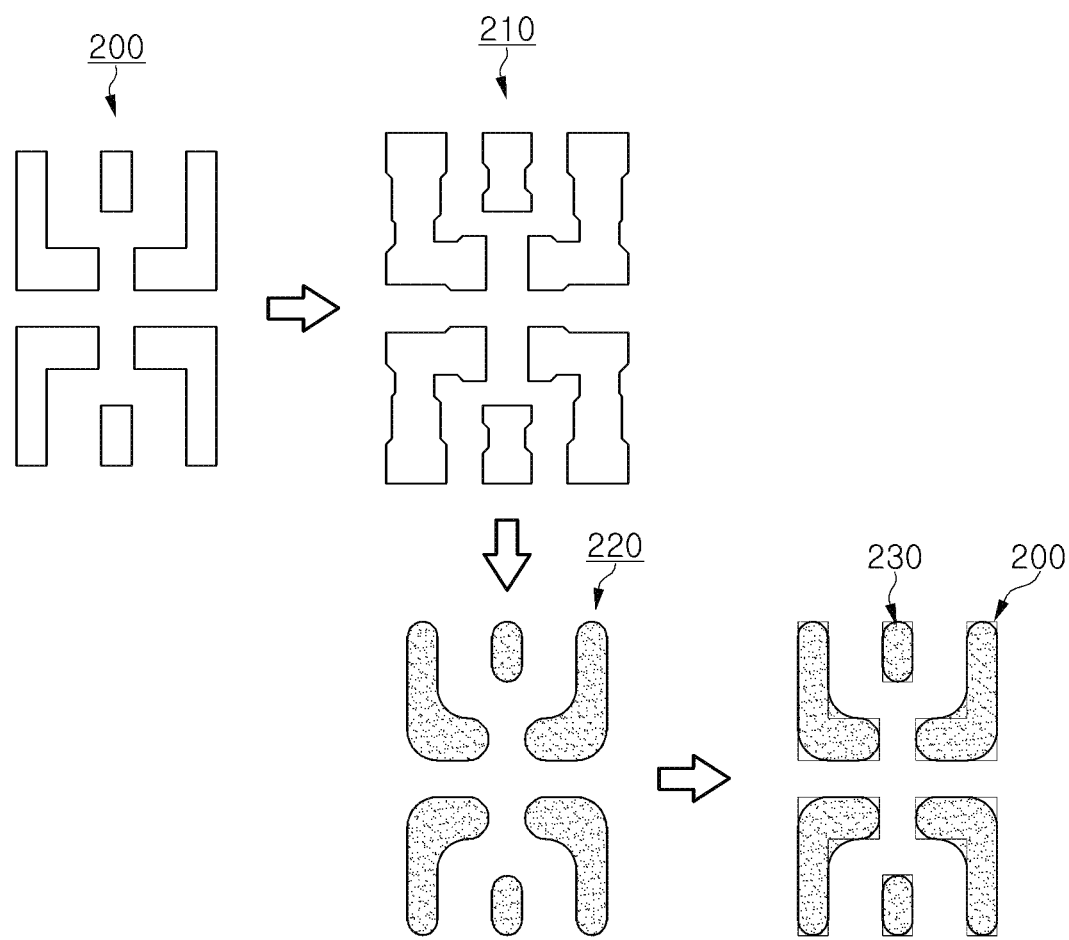
FIG. 3 is a diagram illustrating a proximity correction method of a semiconductor process according to an example embodiment of the present disclosure.

FIG. 3 is a diagram illustrating a proximity correction method of a semiconductor process according to an example embodiment.

Referring to FIG. 3, first layout data 200 in which patterns to be formed on the semiconductor substrate are designed may be generated. For example, the first layout data 200 may be provided as data in a graphic design system (GDS) format, and may include design information of semiconductor devices to be formed on the semiconductor substrate. As described above, DRC and LVS may be performed on the first layout data 200. When the first layout data 200 is determined through the above processes, optical proximity correction (OPC) may be performed for the first layout data 200 using a predetermined OPC model. As a result of the optical proximity correction, second layout data 210 may be generated. In example embodiments, process proximity correction (PPC) may be performed prior to performing the optical proximity correction.

As illustrated in FIG. 3, at least a portion of the patterns included in the second layout data 210 to which the optical proximity correction is applied may have a shape and/or size different from those of the patterns included in the first layout data 200. A mask 220 having patterns may be generated based on the second layout data 210.

As an example, a photolithography process in which light may be irradiated to pass through the patterns included in the second layout data 210 or to pass through an area other than the patterns included in the second layout data 210 may be performed, thereby obtaining the mask 220. The patterns included in the mask 220 may have a shape and/or size different from those of the patterns included in the second layout data 210 due to the optical proximity effect occurring in the photolithography process.

Thereafter, by performing a semiconductor process using the mask 220, the patterns 230 may be formed on the semiconductor substrate. For example, in an etching process, the semiconductor substrate and at least one of the layers disposed on the semiconductor substrate may be etched in an area exposed by the patterns included in the mask 220. In example embodiments, an area not covered by the patterns included in the mask 40 may be etched.

Referring to FIG. 3, the actual patterns 230 formed on the semiconductor substrate may not completely match the first layout data 200. The optical proximity correction may reduce a difference between the patterns 230 formed on the semiconductor substrate and the first layout data 200 by compensating for the optical proximity effect. In an example embodiment, a method for swiftly verifying an OPC model used for optical proximity correction and effectively predicting an error in the OPC model may be suggested. In the method in an example embodiment, using a machine learning model, the verification of the OPC model may be swiftly performed for a large area of the first layout data 200. Accordingly, the OPC model may be swiftly optimized such that that the difference between the patterns 230 formed by the semiconductor process and the first layout data 200 may be reduced, and a yield of the semiconductor process may improve.

Figure 4:
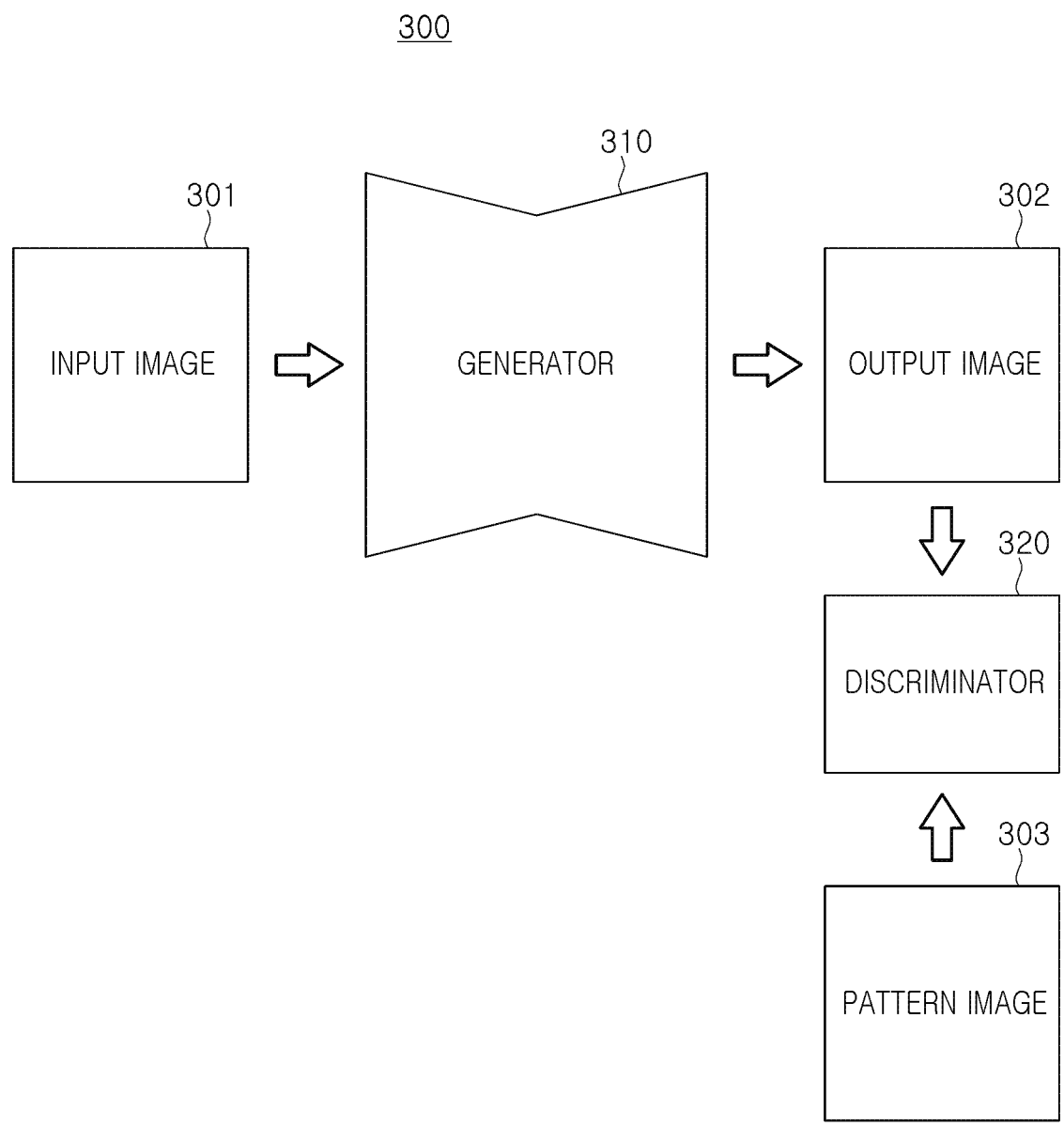
FIG. 4 is a diagram illustrating a method of training a machine learning model according to an example embodiment of the present disclosure.

FIG. 4 is a diagram illustrating a training method of a machine learning model according to an example embodiment.

Referring to FIG. 4, a machine learning model 300 in an example embodiment may include generative adversarial networks, and may include a generator 310 and a discriminator 320. The generator 310 may generate an output image 302 by receiving an input image 301, and may include an encoder and a decoder. For example, the input images 301 received by the generator 310 may be extracted from layout data designed for patterns to be formed by a semiconductor process. The generator 310 may perform a semiconductor process based on the layout data using the input image 301, thereby generating patterns expected to be formed on the semiconductor substrate as the output image 302.

The discriminator 320 may compare the output image 302 with the pattern image 303. The pattern image 303 may be an image of actual patterns formed by performing a semiconductor process based on layout data to which an OPC model is applied, and may be an SEM image or a TEM image. For example, in the machine learning model 300, the training of the generator 310 may be performed until the discriminator 320 does not distinguish between the output image 302 and the pattern image 303.

Figure 5:
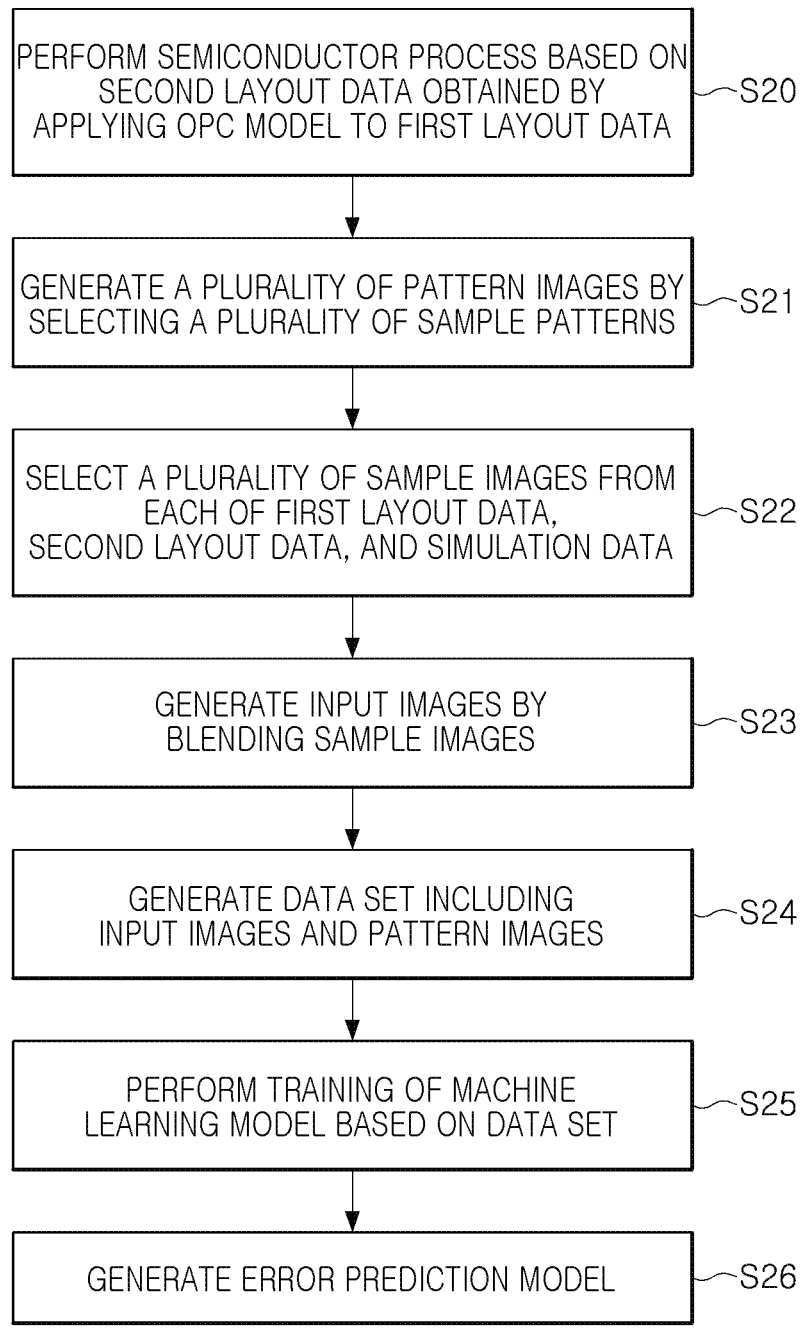
FIG. 5 is a flowchart illustrating a method of training a machine learning model according to an example embodiment of the present disclosure.

FIG. 5 is a flowchart illustrating a training method of a machine learning model according to an example embodiment.

Referring to FIG. 5, the training of a machine learning model in an example embodiment may start by performing a semiconductor process using second layout data obtained by applying an OPC model to first layout data (S20). As described above, the first layout data may be generated by a design tool, and the second layout data may be obtained by performing optical proximity correction on the first layout data using a predetermined OPC model. Patterns designed based on the first layout data may be formed on the semiconductor substrate by the semiconductor process.

When the semiconductor process is completed, a plurality of sample patterns may be selected from among the patterns formed on the semiconductor substrate, and a plurality of pattern images may be generated (S21). The sample patterns may be selected from a plurality of areas of the semiconductor substrate, and the pattern images may be SEM images or TEM images of the sample patterns.

Thereafter, a plurality of sample images may be selected from each of the first layout data, the second layout data, and simulation data (S22). The simulation data may be derived as a result of a simulation for predicting patterns to be formed on the semiconductor substrate by performing a photolithography process using the second layout data. In process S22, the sample images may be selected from each of the first layout data, the second layout data, and the simulation data, and may be selected from areas corresponding to the plurality of areas from which the sample patterns are selected in process S21.

Thereafter, input images may be generated by blending the sample images (S23). For example, a single input image may be generated by blending three sample images selected in the same position of each of the first layout data, the second layout data, and the simulation data. Accordingly, a plurality of input images may be obtained for the plurality of areas of each of the first layout data, the second layout data, and the simulation data, from which the sample images are selected.

The plurality of input images may form a data set together with the plurality of pattern images obtained in process S21 (S24), and training of a machine learning model may be performed using the data set (S25). Hereinafter, the training method will be described in greater detail with reference to FIG. 4.

As described above with reference to FIG. 4, the machine learning model 300 may include a generator 310 and a discriminator 320. The input images 301 generated in process S23 may be input to the generator 310, and the generator 310 may generate output images 302 corresponding to the input images 301. As an example, the output images 302 may represent patterns expected to be formed on the semiconductor substrate when the semiconductor process is performed using the second layout data used to form the input images 301.

The discriminator 320 may compare the output images 302 with the pattern images 303. As described above, sample images may be selected from the first layout data, the second layout data, and the simulation data in the area corresponding to the position in which the pattern images 303 are obtained, and by blending the sample images, the input images 301 may be generated. The discriminator 320 may match the output images 302 to the pattern images 303 based on the positions of the input images 301 and may compare the output images 302 with the pattern images 303. The generator 310 may perform the training until the discriminator 320 does not distinguish between the output images 302 and the pattern images 303. The generator 310 after being trained may be provided as an error prediction model (S26).

Figure 6:
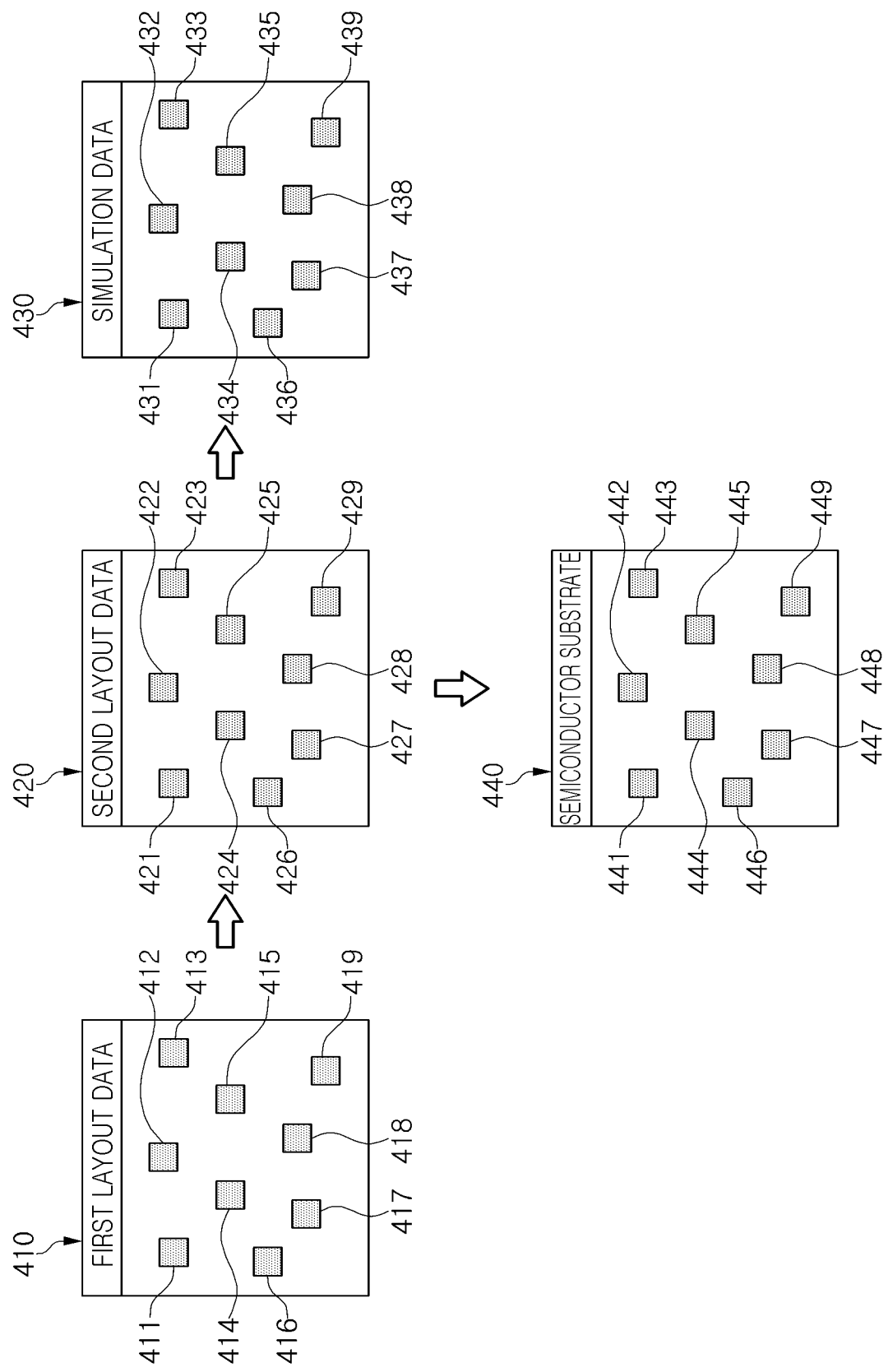
FIGS. 6 and 7 are diagrams illustrating a method of generating input images for training of a machine learning model according to an example embodiment of the present disclosure.
Figure 7:
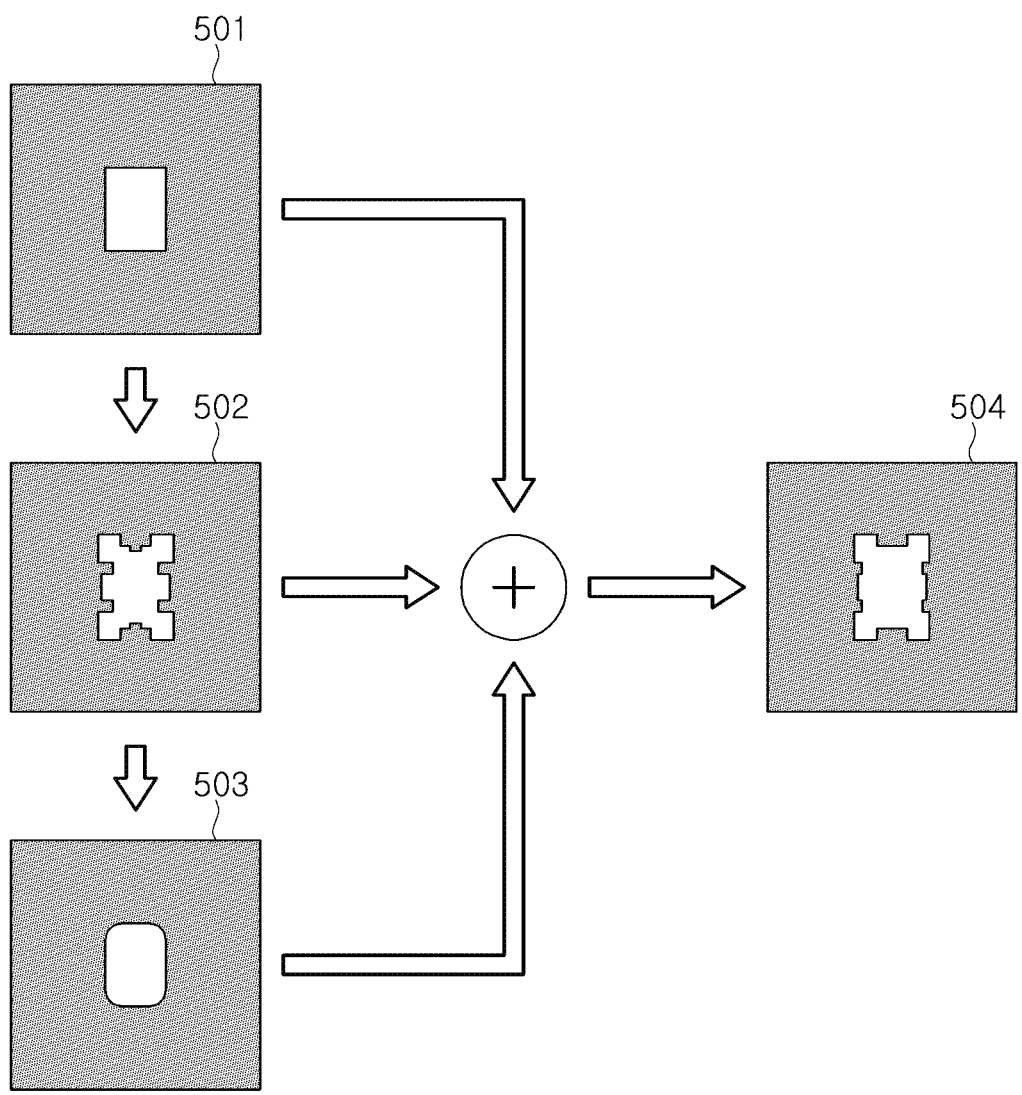

FIGS. 6 and 7 are diagrams illustrating a method of generating input images for training of a machine learning model according to an example embodiment.

FIG. 6 is a diagram illustrating a method of generating input images and sample images. Referring to FIG. 6, sample images 411-419, 421-429, and 431-439 may be obtained from each of first layout data 410, second layout data 420, and simulation data 430. A semiconductor process may be performed using a mask generated based on the second layout data 420 to form a plurality of patterns on a semiconductor substrate 440, and a plurality of pattern images 441-449 may be obtained from the plurality of patterns of the semiconductor substrate 440. The pattern images 441-449 may be SEM images obtained from sample patterns selected from among the patterns formed on the semiconductor substrate 440.

When the patterns are formed on the semiconductor substrate 440 by the semiconductor process performed, based on the second layout data 420, sample patterns may be selected from among the patterns and SEM images of the sample patterns may be obtained as the pattern images 441-449. Areas corresponding to the sample patterns may be selected from each of the first layout data 410, the second layout data 420, and the simulation data 430, and the sample images 411-419, 421-429, and 431-439 may be generated. Accordingly, as illustrated in FIG. 6, the sample images 411-419, 421-429, and 431-439 may be generated in corresponding positions in the first layout data 410, the second layout data 420, and the simulation data 430.

As described above, the second layout data 420 may be obtained by applying optical proximity correction to the first layout data 410 based on a predetermined OPC model, and the simulation data 430 may be obtained by simulating the semiconductor process using the second layout data 420. Therefore, although the data is for forming the same pattern, the sample images 411-419 of the first layout data 410, the sample images 421-429 of the second layout data 420, and the sample images 431-439 of the simulation data 430 may have different sizes and shapes.

In an example embodiment, an input image may be formed by blending the sample images 411-419, 421-429, and 431-439. For example, a single first input image may be generated by blending the first sample images 411, 421, and 431 selected in a position corresponding to the first pattern image 441. Similarly, a single second input image may be generated by blending the second sample images 412, 422, and 432 selected in a position corresponding to the second pattern image 442. The remaining input images may be generated for the other pattern images 443 to 449. Accordingly, in the example embodiment illustrated in FIG. 6, nine input images may be generated using the sample images 411-419, 421-429, and 431-439.

FIG. 7 may be a diagram illustrating a method of generating an input image by blending sample images. Referring to FIG. 7, a single input image 504 may be generated by blending three sample images 501-503. Among the sample images 501-503, the first sample image 501 may be extracted from the first layout data. For example, the first sample image 501 may be extracted from layout data generated by a predetermined design tool to perform the semiconductor process.

The second sample image 502 may be extracted from the second layout data. The second layout data may be obtained by performing optical proximity correction using an OPC model on the first layout data. Accordingly, the pattern included in the second sample image 502 may have a shape and size different from those of the pattern included in the first sample image 501.

The third sample image 503 may be extracted from simulation data, and the simulation data may be obtained by simulating the semiconductor process using the second layout data. For example, the pattern of the third sample image 503 may be expected to be formed on the semiconductor substrate when a mask is generated using the pattern of the second sample image 502 and the semiconductor process is performed using the mask.

In an example embodiment, the single input image 504 may be generated by blending the sample images 501-503, and accordingly, a contour of the input image 504 may be determined by contours of the patterns included in the sample images 501-503. The input image 504 generated as a result of the blending may be input to the machine learning model, and the machine learning model may generate an output image corresponding to the input image 504. The blending described herein may be performed by aligning and overlaying the images on each other, as can be seen for example in FIG. 7, or according to one of various other known image blending or overlay techniques (e.g., using masks, layering, etc.). During the blending, a predetermined weights can be applied to the sample images 501-503, and one of the sample images 501-503 in which a higher weight is applied may be displayed stronger than other one of the sample images 501-503 in which a lower weight is applied. The pattern included in the output image may correspond to the pattern included in the input image 504, and may be predicted by the machine learning model to be formed on the semiconductor substrate by the semiconductor process using the second layout data. In example embodiments, the machine learning model may output a predictive value for a critical dimension of a pattern expected to be formed on the semiconductor substrate, rather than an output image.

In example embodiments, in the process of generating the single input image 504 by blending the sample images 501-503, predetermined weights may be provided to the sample images 501-503. For example, a second weight provided to the second layout data may be greater than a first weight provided to the first layout data. The configuration may consider the fact that an actual semiconductor process may be performed, based on the second layout data to which optical proximity correction using the OPC model is applied.

Figure 8:
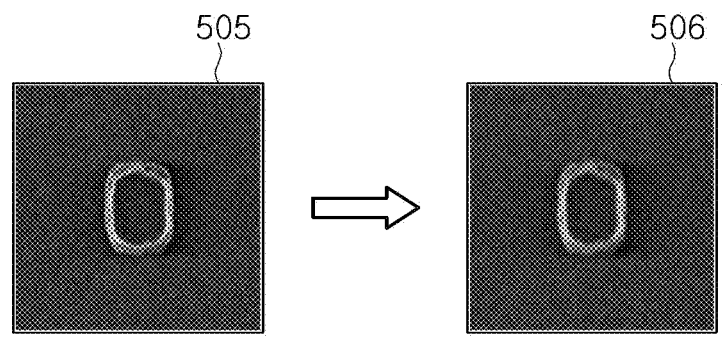
FIG. 8 is diagrams illustrating a method of generating pattern images for training of a machine learning model according to an example embodiment of the present disclosure.

FIG. 8 is diagrams illustrating a method of generating pattern images for training of a machine learning model according to an example embodiment.

As described above with reference to FIG. 7, the machine learning model may generate an output image by receiving the input images 504 generated by blending the sample images 501-503. The output image may be generated by a generator implemented with generative adversarial networks in a machine learning model, and may be compared with a pattern image 505 or its filtered pattern image 506 by a discriminator. In an example embodiment, the training of the machine learning model may be performed until the discriminator recognizes no difference between the output image output by the generator and the pattern image 505 or its filtered pattern image 506.

The pattern image 505 or its filtered pattern image 506 to be compared with the output image by the discriminator may be SEM images or TEM images obtained from the semiconductor substrate on which the semiconductor process has been actually performed, as illustrated in FIG. 8. In an example embodiment, the discriminator may receive the pattern image 505 obtained from the semiconductor substrate as is and may compare the image with the output image, or the discriminator may compare the filtered pattern image 506 with the output image. The filtered pattern image 506 may be obtained by applying at least one of a blur filter and a median filter to the pattern image 505, thereby sharpening contours (or edges) of the pattern image 505. By filtering the pattern image 505 using at least one of a blur filter and a median filter, as illustrated in FIG. 8, noise in an area surrounding the pattern may be reduced, and the comparison performance of the discriminator may improve.

Figure 9:
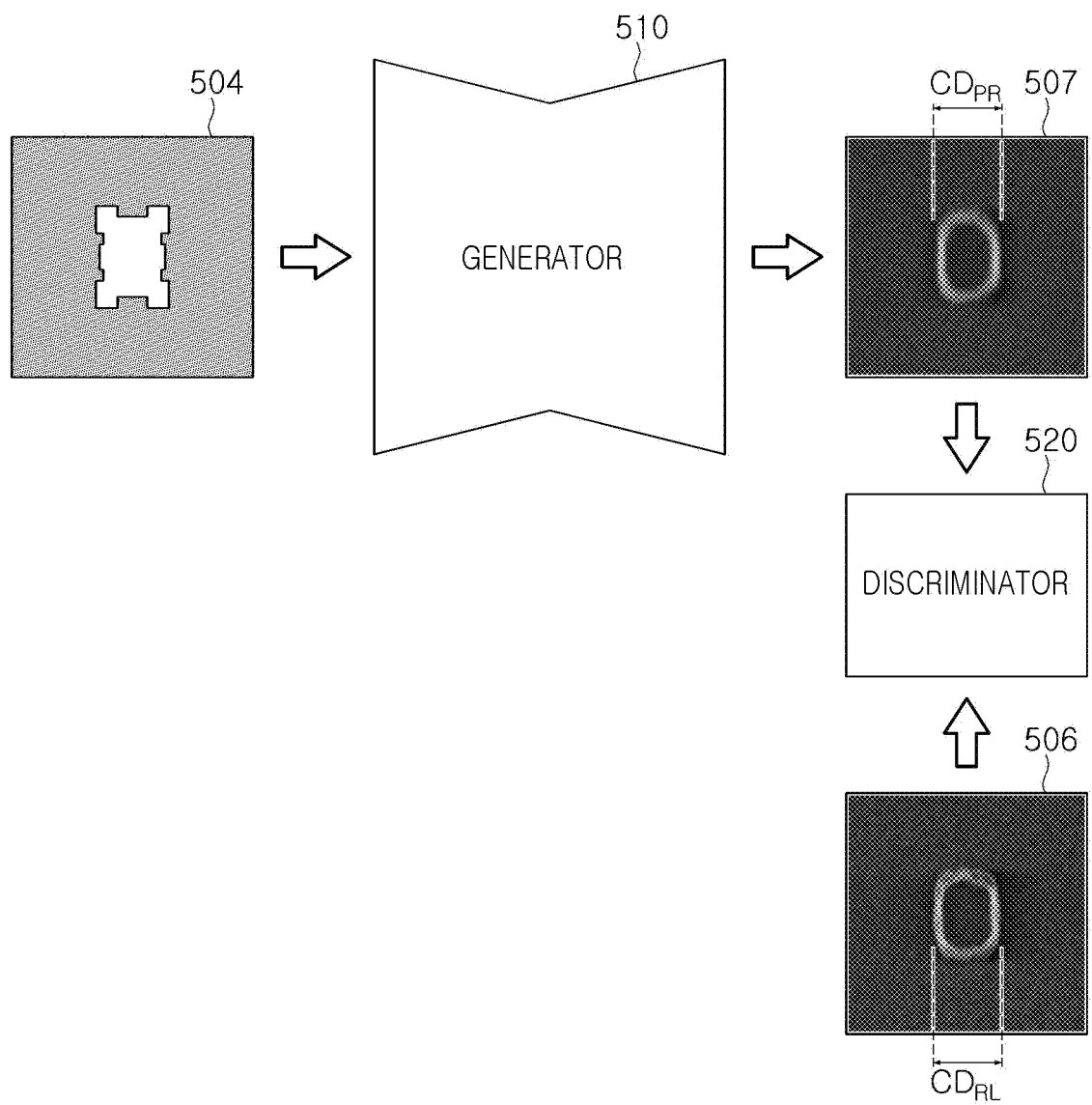
FIG. 9 is a diagram illustrating a method of training a machine learning model according to an example embodiment of the present disclosure.

FIG. 9 is a diagram illustrating a training method of a machine learning model according to an example embodiment.

Referring to FIG. 9, a machine learning model 500 in an example embodiment may include generative adversarial networks, and may include a generator 510 and a discriminator 520. Operations of the generator 510 and the discriminator 520 may be similar to the aforementioned example embodiment described with reference to FIG. 4.

Referring to FIG. 9, an input image 504 may be input to the generator 510. The input image 504 may be generated by blending sample images 501-503 obtained from first layout data, second layout data, and simulation data as described above with reference to FIG. 7. The generator 510 receiving the input image 504 may output the output image 507, and the discriminator 520 may compare the output image 507 with the filtered pattern image 506. The training of the generator 510 may be performed until the discriminator 520 is not able to recognize that the output image 507 is different from the filtered pattern image 506.

As an example, the discriminator 520 may compare critical dimensions of the patterns included in the output image 507 with the filtered pattern image 506, in addition to comparing the output image 507 with the filtered pattern image 506 (e.g., comparing contours of the output image 507 with contours of the filtered pattern image 506). Referring to FIG. 9, a pattern of the output image 507 may have a predictive critical dimension $CD_{PR}$, and a pattern of the filtered pattern image 506 may have an actual critical dimension $CD_{RL}$. In an example embodiment, once the discriminator 520 may not be able to distinguish between the output image 507 and the filtered pattern image 506, the training of the generator 510 may continue to be performed until a difference between the predictive critical dimension $CD_{PR}$ and the actual critical dimension $CD_{RL}$ decrease to a predetermined reference value or lower.

Figure 10:
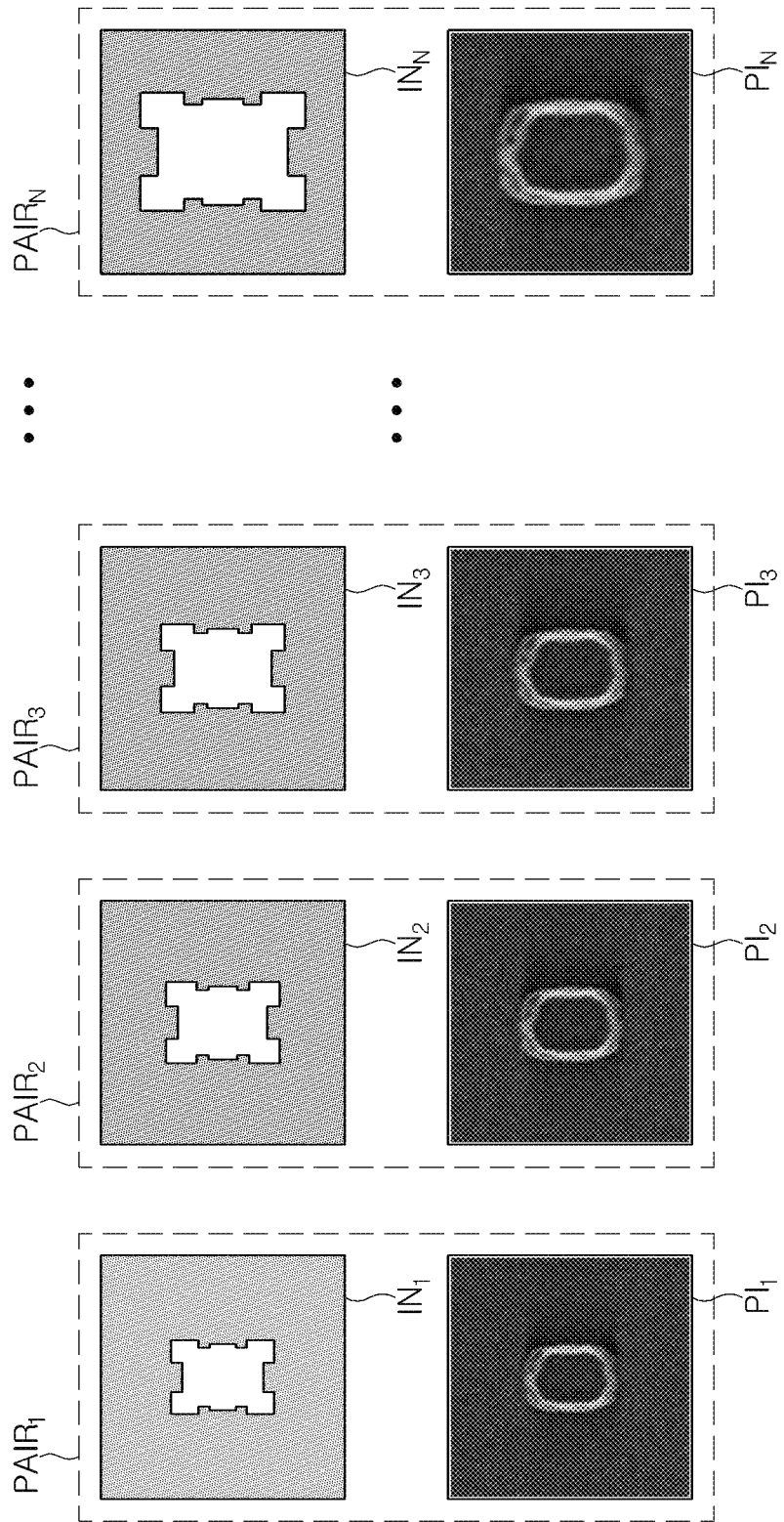
FIG. 10 is a diagram illustrating a data set generating method for training a machine learning model according to an example embodiment of the present disclosure.

FIG. 10 is a diagram illustrating a data set generating method for training of a machine learning model according to an example embodiment.

The data set may be prepared for training the machine learning model, and may include input images and pattern images as described above. The input images and the pattern images may be selected in corresponding positions, and accordingly, one of the input images and one of the pattern images corresponding thereto may form an image pair. To increase accuracy of the machine learning model, the number of image pairs included in the data set may be increased.

However, since it is necessary to configure each of the pattern images as an SEM image or a TEM image obtained from the semiconductor substrate on which the semiconductor process has been completed, when the number of image pairs simply increases, it may take relatively long time to obtain the SEM image or TEM image. Accordingly, in an example embodiment, a data augmentation method in which the number of image pairs included in the data set may be increased by increasing a size of the pattern included in the image pair may be used.

Referring to FIG. 10, a first input image $IN_1$ generated by blending sample images obtained from each of first layout data, the second layout data, and the simulation data, and a first pattern image $PI_1$ corresponding to the first input image $IN_1$ may form a first image pair $PAIR_1$. The first pattern image Phi may be an SEM image or a TEM image actually obtained from the semiconductor substrate after the semiconductor process is completed.

In an example embodiment, for the data augmentation, a pattern included in the first input image $IN_1$ and a pattern included in the first pattern image $PI_1$ may be increased at the same ratio to generate new image pairs $PAIR_2$-$PAIR_N$. For example, a second image pair $PAIR_2$ including a second input image $IN_2$ and a second pattern image $PI_2$, obtained by increasing the pattern included in the first input image $IN_1$ and the pattern included in the first pattern image $PI_1$ by A times, may be generated. Similarly, a third image pair $PAIR_3$ may be generated by increasing the pattern included in the first input image $IN_1$ and the pattern included in the first pattern image $PI_1$ by B times. A and B may be real numbers, and B may be greater than A. Accordingly, the new image pairs $PAIR_2$-$PAIR_N$ may be generated based on the single image pair $PAIR_1$ without further obtaining SEM images or TEM images from the semiconductor device, thereby increasing capacity (e.g., the size) of the data set and improving training accuracy of the machine learning model.

In example embodiments, the data augmentation technique described with reference to FIG. 10 may be performed in a direction of increasing the sizes of the pattern included in the first input image $IN_1$ and the pattern included in the first pattern image $PI_1$, which may be because a minimum value of the critical dimension of the pattern formed on the semiconductor substrate by the semiconductor process is limited. For example, when the sizes of the pattern included in the first input image $IN_1$ and the pattern included in the first pattern image $PI_1$ are decreased for the data augmentation, the training of the machine learning model may be performed, based on the patterns having a critical dimension smaller than a critical dimension able to be formed in an actual semiconductor process, such that training accuracy may be lowered. In some embodiments, the semiconductor substrate has no patterns with a size smaller than a critical dimension, and thus, training with patterns with a size smaller than the critical dimension does not improve the training accuracy.

Figure 11:
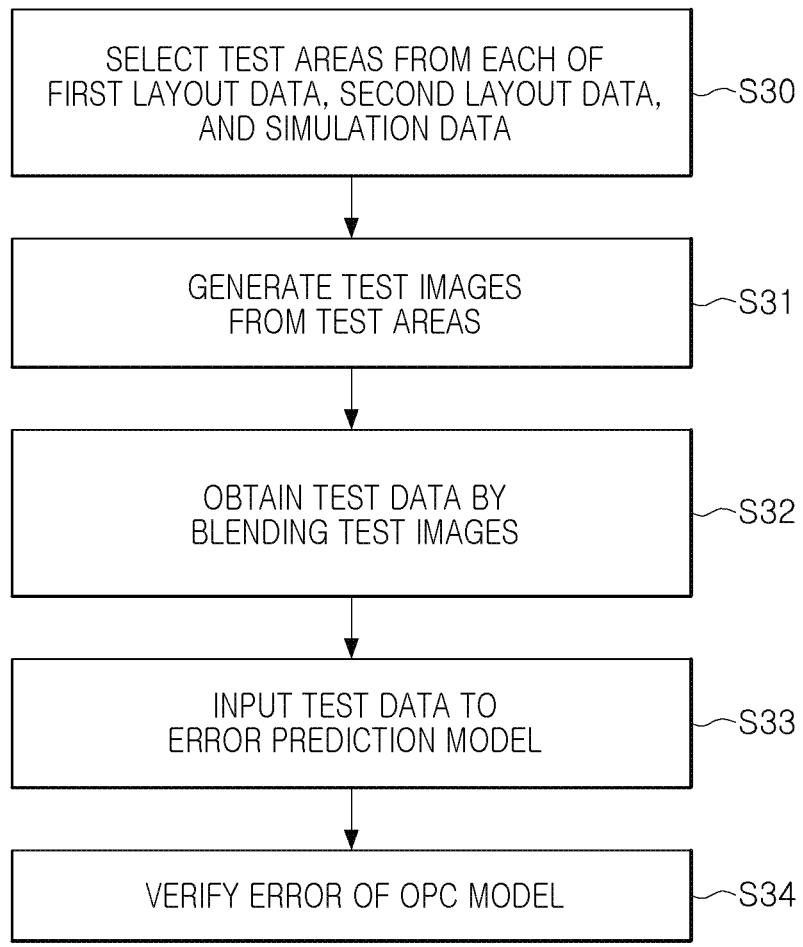
FIG. 11 is a flowchart illustrating a method of verifying an error of an OPC model using an error prediction model according to an example embodiment of the present disclosure.

FIG. 11 is a flowchart illustrating a method of verifying an error of an OPC model using an error prediction model according to an example embodiment.

Referring to FIG. 11, a method of verifying an error of an OPC model in an example embodiment may be executed using an error prediction model, a machine learning model of which training has been completed. The training of the machine learning model may be understood with reference to the above-described example embodiments. For example, input images may be generated by blending sample images obtained from first layout data, second layout data, and simulation data, and pattern images, SEM images or TEM images corresponding to the input images, may be obtained from the semiconductor substrate. The training of the machine learning model may be performed using the input images and the pattern images, and the machine learning model of which the training has been completed may be provided as an error prediction model. To increase training accuracy of the machine learning model, filtering of the pattern images and the data augmentation technique may be applied.

The method of verifying an error of the OPC model may start by selecting test areas from each of the first layout data, the second layout data, and the simulation data (S30). Each of the test areas may include at least a single test pattern.

The test areas may be in different positions from those of areas of the first layout data, the second layout data, and the simulation data, from which the sample images are selected to generate an input image in the process of training the machine learning model. In an example embodiment, a size of each of the test areas may be the same as a size of each of the areas from which the sample images are selected. When the test areas are determined, test images including the test patterns may be generated (S31).

The test images may be blended in the same manner as in the method of blending the sample images to generate the input image in the aforementioned example embodiment. Test data may be obtained by blending the test images (S32). For example, when the blending is performed by providing weights to the sample images in the process of generating the input images for the training of the machine learning model, the same weights may be provided to the test images.

The test data may be input to the error prediction model (S33), and the error prediction model may output predictive values corresponding to the test data. As an example, the predictive values may be obtained by predicting a critical dimension of a pattern formed on the semiconductor substrate using at least one of the first layout data, the second layout data, and the simulation data, used to generate the test data.

Thereafter, an error of the OPC model may be verified using the predictive values (S34). In an example embodiment, an error of the OPC model may be verified by comparing the predictive value obtained for each of the test patterns with a critical dimension of the test pattern of the first layout data. The critical dimension of the test pattern included in the first layout data may correspond to an original design and may be a critical dimension originally intended by the designer. Therefore, using a difference between the predictive value output for the test pattern by the error prediction model and the critical dimension of the test pattern included in the first layout data, it may be determined whether the optical proximity correction has been properly performed by the OPC model, and an error of the OPC model may be verified.

As an example, when an error is found in the first OPC model used in optical proximity correction applied to the first layout data, a second OPC model different from the first OPC model may be generated by correcting the found error. Before applying the optical proximity correction of the second OPC model to the first layout data, error verification for the second OPC model may be performed using an error prediction model. When the error verification for the second OPC model is completed, optical proximity correction may be performed on the first layout data using the second OPC model. The present invention is not limited thereto. In some embodiments, when the verifying of an error of the first OPC model is determined as the first OPC model having an error, the second OPC model may be generated by correcting the found error of the first OPC model, a second error prediction model may be generated by training the machine learning model using input data including third layout data generated by applying the second OPC model to the first layout data and simulation data obtained from the third layout data, and the second OPC model may be verified using the second error prediction model.

To effectively verify the error of the OPC model, areas in which it is highly likely that a problem may occur in the semiconductor process may be selected as the test areas. For example, an area in which a bent pattern is disposed or a large number of patterns are disposed in a small area may be determined as the test areas.

Figure 12:
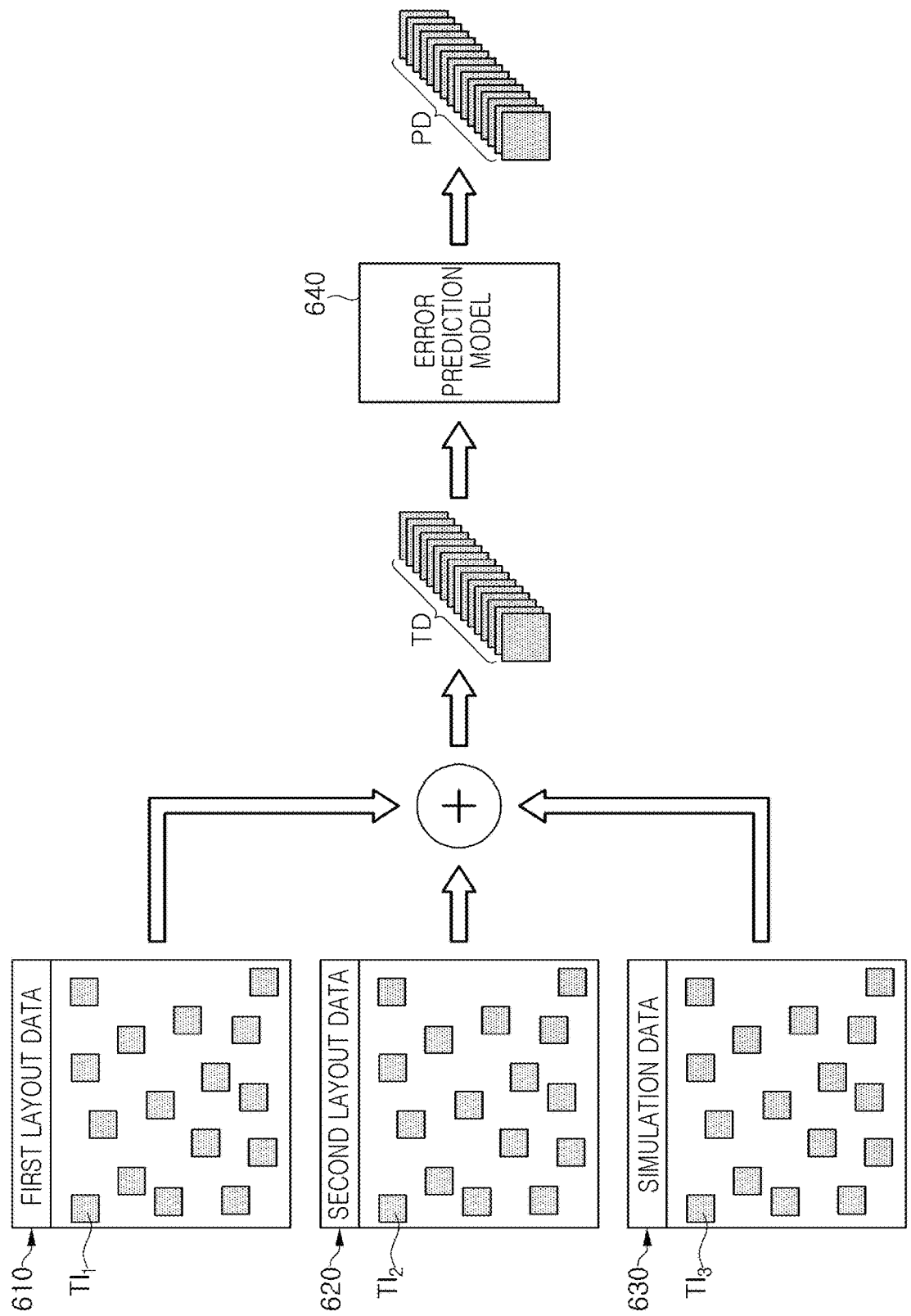
FIG. 12 is a diagram illustrating a method of predicting an error of an OPC model using an error prediction model according to an example embodiment of the present disclosure.

FIG. 12 is a diagram illustrating a method of predicting an error of an OPC model using an error prediction model according to an example embodiment.

Referring to FIG. 12, first layout data 610, second layout data 620, and simulation data 630 may be prepared. The first layout data 610, the second layout data 620, and the simulation data 630 may be applied to a process of training a machine learning model for generating an error prediction model. First to third test images $TI_1$-$TI_3$ may be selected from the first layout data 610, the second layout data 620, and the simulation data 630. The first to third test images $TI_1$-$TI_3$ may be images not applied to the process of training the machine learning model for generating an error prediction model.

Thereafter, a plurality of test data TD may be generated by blending the first to third test images $TI_1$-$TI_3$. The blending may be similar to the blending in the process of training the machine learning model as described with reference to FIGS. 4 to 10. For example, single test data TD may be generated by blending the first to third test images $TI_1$-$TI_3$ disposed in the same position in the first layout data 610, the second layout data 620, and the simulation data 630. In the example embodiment illustrated in FIG. 12, 16 first test images $TI_1$, 16 second test images $TI_2$, and 16 third test images $TI_3$ may be selected, and accordingly, 16 pieces of test data TD may be generated.

The test data TD may be input to the error prediction model 640. The error prediction model 640 may output predictive data PD corresponding to the test data TD. For example, in response to 16 pieces of test data TD, the error prediction model 640 may output 16 pieces of predictive data PD. In an embodiment, the error prediction model 640 may be the generator 310 after being trained using the method of training a machine learning model described with reference to FIG. 5.

Each of the predictive data PD may be obtained by predicting an image and/or a critical dimension of each of the patterns formed on the semiconductor substrate by performing a semiconductor process based on at least one of the first layout data 610, the second layout data 620, and the simulation data 630. For example, the error prediction model 640 may output the predictive value of the critical dimension of each of the patterns formed on the semiconductor substrate using the second layout data 620 obtained by applying optical proximity correction to the first layout data 610 using the OPC model.

In the example embodiment illustrated in FIG. 12, the predictive values of the critical dimensions included in the predictive data PD may be obtained by predicting a critical dimension of when the patterns included in the second test images TI$_2$ selected from the second layout data 620 are actually formed by the semiconductor process. Accordingly, a design value of the critical dimension of each of the patterns included in the first test images TI$_1$ selected from the first layout data 610 may be compared with the predictive value of the critical dimension output by the error prediction model 640 to verify accuracy and an error of the OPC model.

Figure 13:
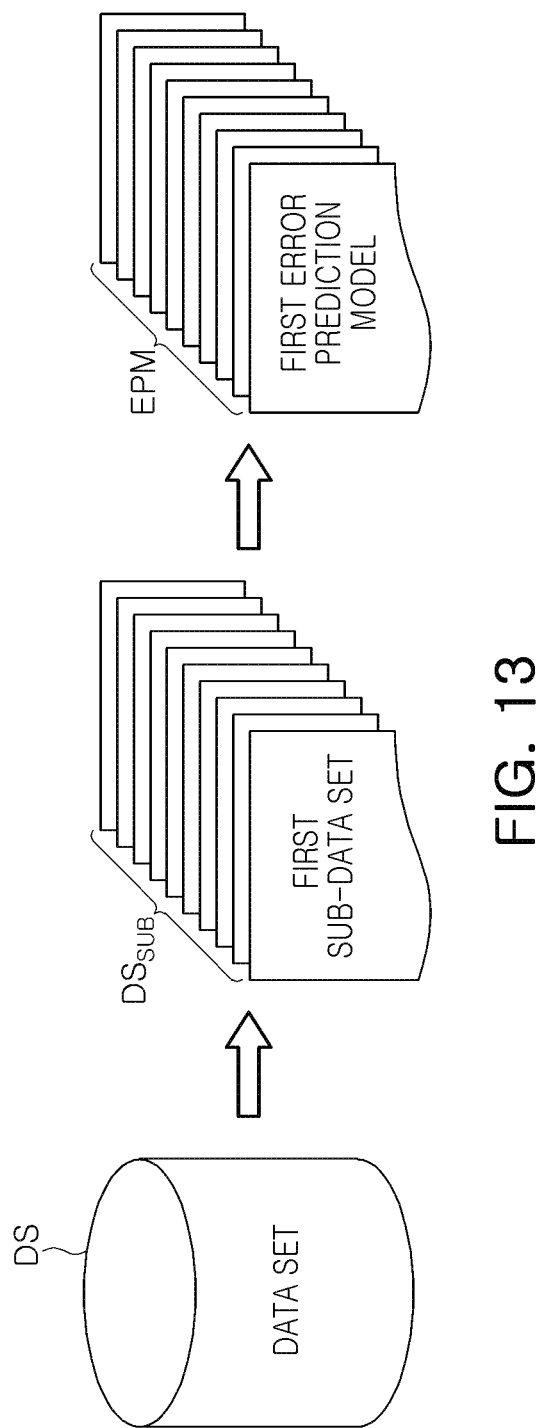
FIGS. 13 and 14 are diagrams illustrating a method of generating an error prediction model according to an example embodiment of the present disclosure.
Figure 14:
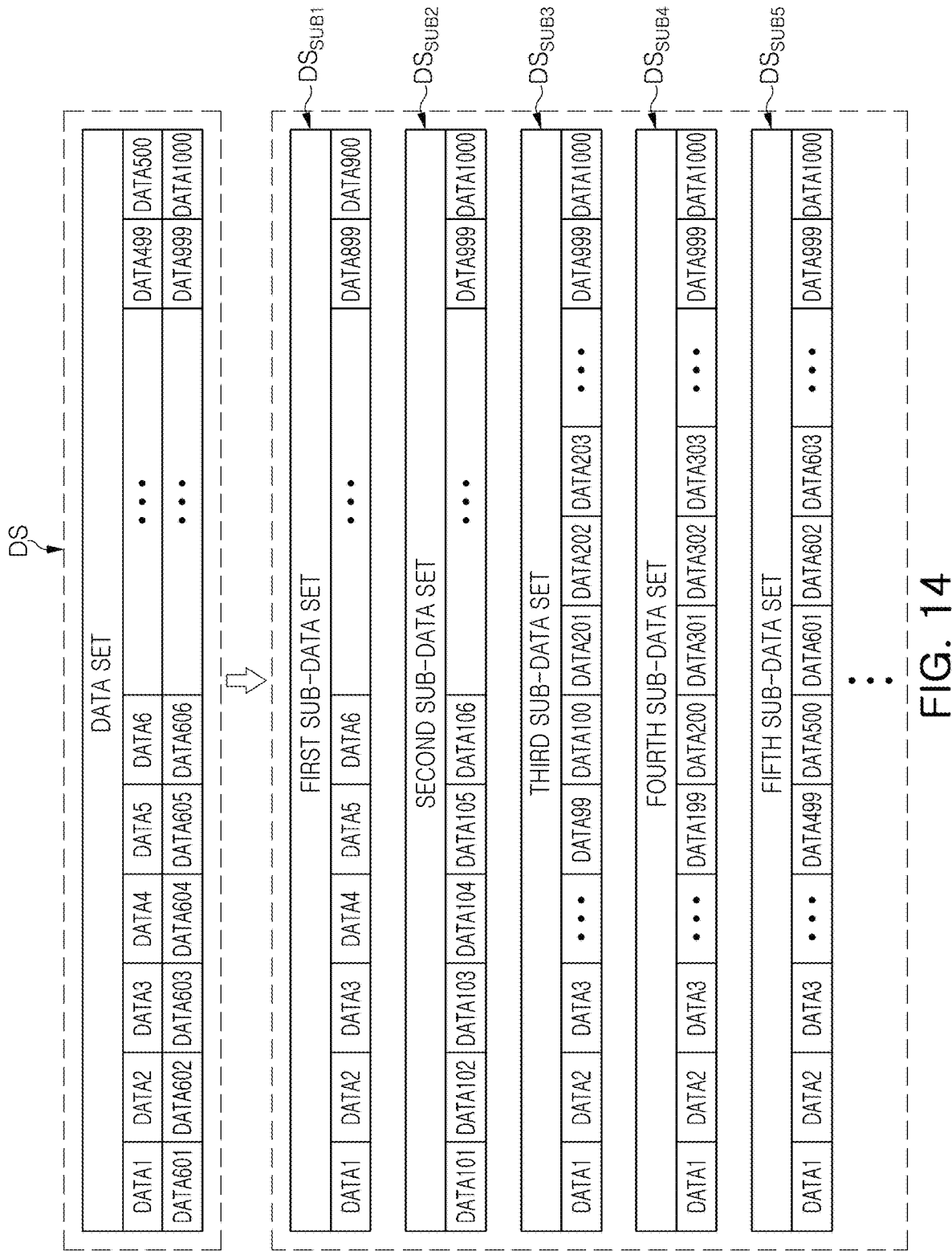

FIGS. 13 and 14 are diagrams illustrating a method of generating an error prediction model according to an example embodiment.

Referring to FIG. 13, a data set DS may be provided to generate an error prediction model by training a machine learning model. The data set DS may include input images generated by blending sample images extracted from layout data for performing a semiconductor process, and pattern images, an SEM image or a TEM image, measured from a semiconductor substrate in a position corresponding to the position in which the sample images are extracted. The data set DS may include a plurality of image pairs having a single input image and a single pattern image corresponding thereto. The number of image pairs included in the data set DS may increase by a data augmentation technique described with reference to FIG. 10.

In the example embodiment illustrated in FIG. 13, a plurality of sub-data sets DS$_{SUB}$ may be generated from the data set DS. As an example, the plurality of sub-data sets DS$_{SUB}$ may be generated by selecting different image pairs from among the image pairs included in the data set DS. Accordingly, a portion of the image pairs included in each of the plurality of sub-data sets DS$_{SUB}$ may overlap each other, and another portion thereof does not overlap each other. In the description below, a method of generating the plurality of sub-data sets DS$_{SUB}$ from the data set DS will be described in greater detail with reference to FIG. 14.

Referring to FIG. 14, the data set DS may include 1,000 pieces of data DATA1 to DATA1000. The number of data DATA1 to DATA1000 included in the data set DS is merely an example, and may be varied in example embodiments. Each of the data DATA1 to DATA1000 may include an image pair consisting of an input image and a pattern image corresponding thereto.

In the example embodiment illustrated in FIG. 14, each of the sub-data sets may include or may be formed of 900 pieces of data selected from the data DATA1 to DATA1000 of the data set DS. For example, the first sub-data set DS$_{SUB1}$ may include or may be formed of 900 pieces of data in order from the first data DATA1. The second sub-data set DS$_{SUB2}$ may include or may be formed of 900 pieces of data in order from the 101st data DATA1. Accordingly, in the first sub-data set DS$_{SUB1}$ and the second sub-data set DS$_{SUB2}$, a portion of pieces of data may overlap each other and another portion of pieces of data may not overlap each other. For example, DATA101 to DATA900 are included in each of the first and second sub-data set DS$_{SUB1}$ and DS$_{SUB2}$. Similarly, each of the third to fifth sub-data sets DS$_{SUB3}$-DS$_{SUB5}$ may also be configured to include or may be formed of 900 pieces of data. The number of each of the sub-data sets is not limited thereto.

Referring to FIG. 13, a plurality of error prediction models EPM may be generated using the plurality of sub-data sets DS$_{SUB}$. For example, by independently training a machine learning model prior to the training using the plurality of sub-data sets DS$_{SUB}$, a plurality of error prediction models EPM having completed training differently from each other may be generated. Since the plurality of error prediction models EPM are generated by differently training the machine learning models using the plurality of sub-data sets DS$_{SUB}$, the plurality of error prediction models EPM may output different outputs for the same input.

However, the method described with reference to FIGS. 13 and 14 is merely an example, and a method of generating the plurality of error prediction models EPM may be varied in example embodiments. For example, the plurality of error prediction models EPM may be generated by inputting the same data set DS to the machine learning models implemented with different neural networks. Alternatively, the plurality of error prediction models EPM may be generated by applying different loss functions to the machine learning models implemented with neural networks having the same structure.

In an example embodiment, by using the plurality of error prediction models EPM generated using the different sub-data sets DS$_{SUB}$ as described with reference to FIGS. 13 and 14, accuracy of the verification of error of an OPC model may improve. In the description below, the configuration will be described in greater detail with reference to FIG. 15.

Figure 15:
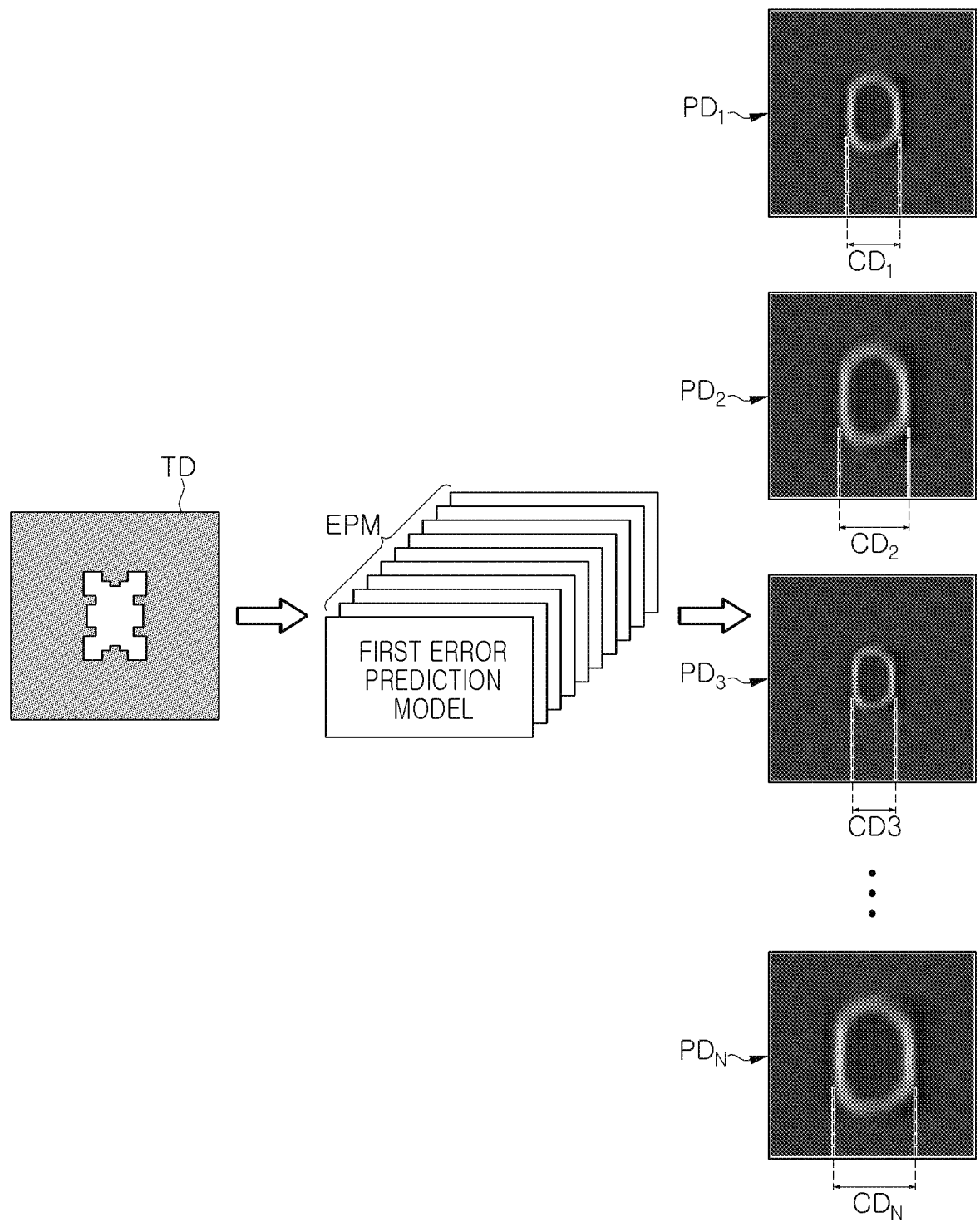
FIG. 15 is a diagram illustrating a method of verifying an error of an OPC model using an error prediction model according to an example embodiment of the present disclosure.

FIG. 15 is a diagram illustrating a method of verifying an error of an OPC model using an error prediction model according to an example embodiment.

Referring to FIG. 15, single test data TD may be input to the plurality of error prediction models EPM generated as described above with reference to FIGS. 13 and 14. The test data TD may be extracted from the layout data from which a data set of generating an error prediction model is extracted. As an example, the test data TD may be generated as described above with reference to FIG. 12.

The test data TD may be input to each of the plurality of error prediction models EPM, and the plurality of error prediction models EPM may output a plurality of predictive data PD$_1$-PD$_N$. Each of the plurality of predictive data PD$_1$-PD$_N$ may include a pattern expected to be formed on the semiconductor substrate when the semiconductor process is performed, based on the layout data used to generate the test data TD.

However, as described above with reference to FIGS. 13 and 14, since the plurality of error prediction models EPM are generated through different training processes, in the plurality of predictive data PD$_1$-PD$_N$ output by the plurality of error prediction models EPM, patterns may have different sizes and/or shapes. When the plurality of predictive data PD$_1$-PD$_N$ are obtained from the plurality of error prediction models EPM, the predictive value of the critical dimension of the pattern corresponding to the test data TD may be determined as an average value of the critical dimensions CD$_1$-CD$_N$ of the pattern obtained from the plurality of predictive data PD$_1$-PD$_N$. In example embodiments, to increase the accuracy of the prediction, the predictive value of the critical dimension of the pattern corresponding to the test data TD may be determined as an average of values other than a maximum value and a minimum value among the critical dimensions CD$_1$-CD$_N$ of the pattern. For example, the maximum and minimum values are not used in the calculation of the average of the values.

According to the aforementioned example embodiments, the training of the machine learning model may be performed using the input images generated by blending the layout data for performing the semiconductor process and the simulation data based on the layout data, and the pattern image obtained from a wafer on which the semiconductor process has been performed. Accordingly, even for the areas of the wafer from which an image of an actual pattern has not been obtained, critical dimensions of the patterns may be predicted using the layout data and the machine learning model, and errors of the OPC model may be accurately verified.

While the example embodiments have been illustrated and described above, it will be apparent to those skilled in the art that modifications and variations could be made without departing from the scope of the present disclosure as defined by the appended claims.

What is claimed is:

1. A method of fabricating a semiconductor device comprising:
generating an optical proximity correction (OPC) model;
generating first layout data;
applying the OPC model to the first layout data to generate second layout data;
performing simulation on the second layout data to generate simulation data;
generating a mask based on the second layout data;
performing a semiconductor process using the mask on a substrate;
obtaining a plurality of pattern images by selecting a plurality of sample patterns from the substrate;
selecting a plurality of first sample images corresponding to the plurality of sample patterns, a plurality of second sample images corresponding to the plurality of sample patterns, and a plurality of third sample images corresponding to the plurality of sample patterns, from the first layout data, the second layout data, and the simulation data, respectively;
generating a plurality of input images by blending the plurality of first sample images, the plurality of second sample images, and the plurality of third sample images, each input image being a blended image of: a corresponding one of the plurality of first sample images, a corresponding one of the plurality of second sample images, and a corresponding one of the plurality of third sample images; and
generating an error prediction model for the OPC model by training a machine learning model using a data set including the plurality of input images and the plurality of pattern images.

2. The method of claim 1,
wherein the machine learning model includes generative adversarial networks (GAN).

3. The method of claim 1,
wherein the first layout data is graphic database system (GDS) data.

4. The method of claim 1,
wherein the machine learning model is trained using the plurality of input images and a plurality of filtered images obtained by filtering the plurality of pattern images, and
wherein the filtering is performed using at least one of a blur filter and a median filter.

5. The method of claim 1, further comprising:
pairing the plurality of input images with the plurality of pattern images to generate a plurality of first image pairs; and
generating a plurality of second image pairs by increasing a size of the plurality of sample patterns included in the plurality of first image pairs,
wherein the data set includes the plurality of first image pairs and the plurality of second image pairs.

6. The method of claim 5, further comprising:
generating a plurality of training data sets by selecting a portion of the first and second image pairs; and
generating a plurality of error prediction models, each being obtained by training the machine learning model using a corresponding one of the plurality of training data sets.

7. The method of claim 6, further comprising:
obtaining a plurality of first test images including a plurality of first test patterns, a plurality of second test images including a plurality of second test patterns, and a plurality of third test images including a plurality of third test patterns from the first layout data, the second layout data, and the simulation data, respectively;
generating a plurality of test data by blending the plurality of first to third test images, each test data corresponding to a blended image of: a corresponding one of the plurality of first test images, a corresponding one of the plurality of second test images, and a corresponding one of the plurality of third test images; and
verifying an error of the OPC model by inputting the plurality of test data to each of the plurality of error prediction models.

8. The method of claim 7,
wherein the error of the OPC model is verified by using an average value of at least a portion of a plurality of predictive values generated by the error prediction models receiving the plurality of test data.

9. The method of claim 8,
wherein each of the plurality of predictive values includes a critical dimension (CD) of a corresponding one of the plurality of first to third test patterns.

10. The method of claim 8,
wherein a maximum value and a minimum value among the plurality of predictive values are not used in calculating of the average value.

11. The method of claim 7,
wherein coordinates of the plurality of first test patterns are different from coordinates of a plurality of patterns, corresponding to the plurality of sample patterns, in each of the simulation data, the first layout data, and the second layout data.

12. The method of claim 1,
wherein the blending of the plurality of the first sample images, the plurality of second sample images, and the plurality of third sample images includes:
multiplying a first predetermined weight, a second predetermined weight, and a third predetermined weight to the plurality of first sample images, the plurality of second sample images, and the plurality of third sample images, respectively, wherein at least one of the first to third predetermined weight is different from the others; and
blending the plurality of first to third sample images weighted with the first to third predetermined weights, respectively, to generate the plurality of input images.

13. The method of claim 1,
wherein the machine learning model is trained by comparing a predictive critical dimension value output by the machine learning model receiving the plurality of input images with an actual critical dimension value measured from the plurality of pattern images.

14. The method of claim 1,
wherein the plurality of pattern images are scanning electron microscope (SEM) images of the plurality of sample patterns.

15. A method of fabricating a semiconductor device comprising:
generating an optical proximity correction (OPC) model;
generating an error prediction model for the OPC model;

selecting a plurality of first test areas from first layout data including design information of semiconductor devices, a plurality of second test areas from second layout data obtained by applying the OPC model to the first layout data, and a plurality of third test areas from simulation data obtained by executing a simulation based on the second layout data;

obtaining a plurality of first test images, a plurality of second test images, and a plurality of third test images from the plurality of first test areas, the plurality of second test areas, and the plurality of third test areas, respectively;

obtaining a plurality of test data by blending the plurality of first test images, the plurality of second test images, and the plurality of third test images, each test data being obtained by blending a corresponding one of the plurality of first test images, a corresponding one of the plurality of second test images, and a corresponding one of the plurality of third test images; and predicting a critical dimension of each of a plurality of test patterns disposed in the plurality of first to third test areas by inputting the plurality of test data to the error prediction model for the OPC model.

16. The method of claim 15, wherein the error prediction model includes a generative adversarial network model trained using a plurality of SEM images of a plurality of sample patterns formed on a wafer by a semiconductor process performed using a mask formed using the second layout data, a plurality of first sample images selected from the first layout data, a plurality of second sample images selected from the second layout data, and a plurality of third sample images selected from the simulation data, and wherein each of the plurality of SEM images corresponds to a respective one of the plurality of first sample images, a respective one of the plurality of second sample images, and a respective one of the plurality of third sample images.

17. A method of fabricating a semiconductor device comprising:

generating first layout data;

applying a first optical proximity correction (OPC) model to the first layout data to generate second layout data;

obtaining a plurality of pattern images from a plurality of selected areas of a substrate on which a semiconductor process is performed using a mask formed from the second layout data;

extracting a plurality of input images corresponding to the plurality of pattern images from a plurality of sample areas of the second layout data, the plurality of sample areas corresponding to the plurality of selected areas;

generating a first error prediction model by training a machine learning model using a data set including the plurality of input images and the plurality of pattern images;

extracting a plurality of test images from a plurality of test areas of the second layout data, different from the plurality of sample areas, and inputting the plurality of test images to the first error prediction model; and verifying an error of the first OPC model using a predictive value generated by the first error prediction model.

18. The method of claim 17, wherein the first error prediction model is generated by training the machine learning model until a difference of a predictive critical dimension of each of a plurality of patterns generated from the machine learning model and an actual critical dimension of a corresponding one of a plurality of sample patterns formed in the plurality of selected areas decreases to a predetermined level or lower.

19. The method of claim 17, wherein the predictive value is a predictive critical dimension of each of a plurality of patterns obtained by the first error prediction model, and wherein an error of the first OPC model is verified by comparing the predictive value of each of the plurality of patterns with a critical dimension of a corresponding one of a plurality of test patterns in the plurality of test areas of the first layout data.

20. The method of claim 17, further comprising:

when the verifying of an error of the first OPC is determined as the first OPC having an error, generating a second OPC model by correcting the error of the first OPC model;

generating a second error prediction model by training the machine learning model using input data including third layout data generated by applying the second OPC model to the first layout data; and verifying the second OPC model using the second error prediction model.

* * * * *